United States Patent [19]

Edwards

[11] Patent Number: 5,268,658
[45] Date of Patent: Dec. 7, 1993

[54] DIGITAL AMPLITUDE MODULATOR AND METHOD OF SIGNAL COMBINING

[75] Inventor: Richard C. Edwards, Cedar Rapids, Iowa

[73] Assignee: Rockwell International Corporation, Seal Beach, Calif.

[21] Appl. No.: 918,859

[22] Filed: Jun. 24, 1992

[51] Int. Cl.⁵ ............................................. H03C 1/00
[52] U.S. Cl. .................................... 332/151; 332/163; 375/41; 455/108
[58] Field of Search ................ 332/151, 152, 153, 154, 332/163, 164, 165, 166; 375/41; 455/102, 108

[56] References Cited

U.S. PATENT DOCUMENTS 4,580,111  4/1986  Swanson ............................. 332/152
4,804,931  2/1989  Hulick .................................. 332/163

OTHER PUBLICATIONS

"Digital Amplitude Modulation", Broadcast Engineering, pp. 66-80, Dec. 1987, Timothy P. Hulick.

*Primary Examiner*—Siegfried H. Grimm
*Attorney, Agent, or Firm*—Kyle Eppele; M. Lee Murrah; H. Fredrick Hamann

[57] ABSTRACT

A digital amplitude modulator receives a plurality of phase coherent input signals from a plurality of amplifiers (A1-An) respectively representing the bits of a plural bit digital word and converts them to a single output signal on an output with a first plurality of transformers having transformer ratios which vary substantially in accordance with a power of two corresponding to the significance of the bit represented by the input signal being converted thereby and a second plurality of transformers having primaries connected to the first plurality of transformers, respectively, and secondaries all connected in series together to an output terminal and transformer ratios which vary in substantial accordance with the same powers of two that the transformer ratio of the first plurality of transformers to which they are connected vary. In one embodiment the second group of transformers are transmission line element transformers with electrical lengths equal to one quarter wavelength, while in another embodiment element coil transformers are employed.

13 Claims, 5 Drawing Sheets

DIGITAL AMPLITUDE MODULATOR AND METHOD OF SIGNAL COMBINING

BACKGROUND OF THE INVENTION

This invention relates generally to digital amplitude modulators and methods of modulating and, particularly, to binary amplitude modulators useable to modulate an analog amplitude signal in accordance with plural bit words.

Digital amplitude modulators which amplitude modulate analog signals in accordance with digital signals are well known as shown in Timothy p. Hulick, "Digital Amplitude Modulation", Broadcast Engineering, pp. 66-80, December, 1987 and U.S. Pat. No. 4,804,931 issued Feb. 14, 1989 to Hulick, incorporated herein by reference. Reference should be made to these documents for the details of operation of such modulators as described by Hulick. While such digital modulators function sufficiently well to be useful, the theoretical efficiency is not independent of the modulation. They also require signals to be in phase quadrature, such that amplitude and phase errors can lead to significant intermodulation and harmonic distortion.

Referring to FIG. 1, central to the prior art digital modulator of Hulick are "n" quadrature hybrid combined signals where "n" is the number of desired binary bits. An analog to digital (A/D) converter 12 that is driven by the amplitude component of the RF input 13, or audio input 15, determines which of "n" high efficiency amplifiers containing the phase component of the RF, such as pin diode switches (PD SW) 14 are switched "on" to pass the RF from a power splitter 16 to amplifiers $A_1$-$A_n$ for summing by quadrature combiners 18. As noted, unlike the 100% efficiency maintained by a Class-D amplifier with collector modulation, the modulator efficiency of the digital modulator of FIG. 1 varies linearly with the modulation index.

Still referring to the prior art digital modulator of FIG. 1, the equations for input power ($P_{in}$), output power ($P_{out}$) and the efficiency (Eff) can be deduced, as given below:

$$P_{in} = 2cV^2M \quad (1)$$

$$P_{out} = 2c^2V^2M^2 \quad (2)$$

$$Eff = P_{out}/P_{in} = cM \quad (3)$$

where:

$c$ = Total number of binary bits
$= (1 - 2^{-n})$ $$M = \frac{1}{c}\left(\frac{m_1}{2} + \frac{m_2}{4} + \frac{m_3}{8} \ldots \frac{m_n}{2^n}\right)$$

V = Output voltage of amplifier #1
shown in FIG. 1 with a
normalized impedance level of
1 ohm for all ports of
the quadrature hybrids.

$m_1$ = 1 for amplifier #1 switched "on"
= 0 for amplifier #1 switched "off"

-continued $m_2$ = 1 for amplifier #2 switched "on"
= 0 for amplifier #2 switched "off"

$m_n$ = 1 for amplifier #n switched "on"
= 0 for amplifier #n switched "off"

Note that "M" in equations (1-3) can be thought of as the modulation index where $0 \leq M \leq 1$, so the efficiency given by equation (3) is a linear function of the modulation index. As a consequence, for the typical 20% average modulation index for voice, the maximum efficiency for c=1 is only 20%.

The efficiency for a two-tone input can be found by substituting M=sin(x) in equations (1-3) where the normalized period of the envelope is pi radians.

$$P_{in} = \frac{2}{\pi}cV^2 \int_0^\pi \sin(x)dx = 4cV^2$$

$$P_{out} = \frac{2}{\pi}c^2V^2 \int_0^\pi \sin^2(x)dx = c^2V^2$$

$$EFF = P_{out}/P_{in} = c\pi/4 = c78.5\%$$

The efficiency is thus identical to the ideal class B amplifier when a large number of bits are used (i.e., c=1 as n→∞). Although the two-tone waveform efficiency is considerably better than for voice inputs, it should be noted that this 78% efficiency assumes no loss in the hybrid combiners 18. Typical commercial hybrids covering the 30-88 Mhz band have approximately 0.7 dB insertion loss which is equivalent to 85% efficiency. Thus, the resultant theoretical two-tone efficiency decreases to approximately 67% (0.85×78%). Moreover, assuming the actual efficiency of the wideband of amplifiers is typically 70%, the combined efficiency degrades approximately to 47% (0.70×67%).

SUMMARY OF THE INVENTION

It is therefore an object of the present invention to provide a digital amplitude modulator and method of combining which eliminates the inherent input power splitter problem of the prior art modulator of FIG. 1 and which also has a wider bandwidth and an improved efficiency while eliminating the need for phase quadrature signals.

The object is achieved in part by providing a digital amplitude modulator for combining the power from a plurality of input signals respectively representing the bits of a plural bit digital word into a single output signal, comprising a plurality of transformers for converting the plurality of input signals, respectively, and having transformer ratios which vary in accordance with powers of two corresponding to the significance of the bit represented by the input signal being converted thereby, and a plurality of transmission line elements having an electrical length equal to a quarter of the wave length of the input signals. The inputs of the plurality of transmission line elements are respectively connected to the plurality of transformers, and their outputs connected in common to each other on an output terminal to produce the single output signal formed of a composite sum of the plurality of input signals.

The objective is also obtained through provision of a digital amplitude modulator for combining the power from a plurality of inputs respectively representing the bits of a plural bit digital word into a single output signal, comprising a first plurality of transformers for converting the input signals, respectively, and having transformer ratios which vary in accordance with powers of two corresponding to the significance of the bit represented by the input signal being converted thereby, and a second plurality of transformers. The second plurality of transformers have primaries respectively connected to the first plurality of transformers, and their secondaries all connected in series to an output terminal. Further, the transformer ratios of the second plurality of transformers vary inversely in accordance with the same powers of two that the transformer ratios of the first plurality of transformers to which they are connected vary.

Preferably, the digital amplitude modulator includes means to provide the input signals with magnitudes that vary inversely in accordance with the same powers of two with respect to which the transformer ratios of the first plurality of transformers vary and includes means for providing the input signals all in coherent phase with one another. Advantageously, the transformers can be made of discrete coil transformers and need not be made of transmission line element transformers, or hybrid transformers, as required in the prior art digital modulator.

Thus, it is seen that a new method of combining power from a plurality of inputs respectively representing the bits of a plural bit digital word into a single output signal is provided, comprising the steps of (1) converting the plurality of inputs to magnitudes which vary in accordance with powers of two corresponding to the significance of the bit represented by the input signal being converted thereby and (2) combining all the converted input signals to form a single output signal defined by a composite sum of the plurality of input signals.

These and other objects, features and advantages are disclosed and claimed in the specification, figures and claims of the present application.

DETAILED DESCRIPTION OF THE FIGURES

Figure 1:
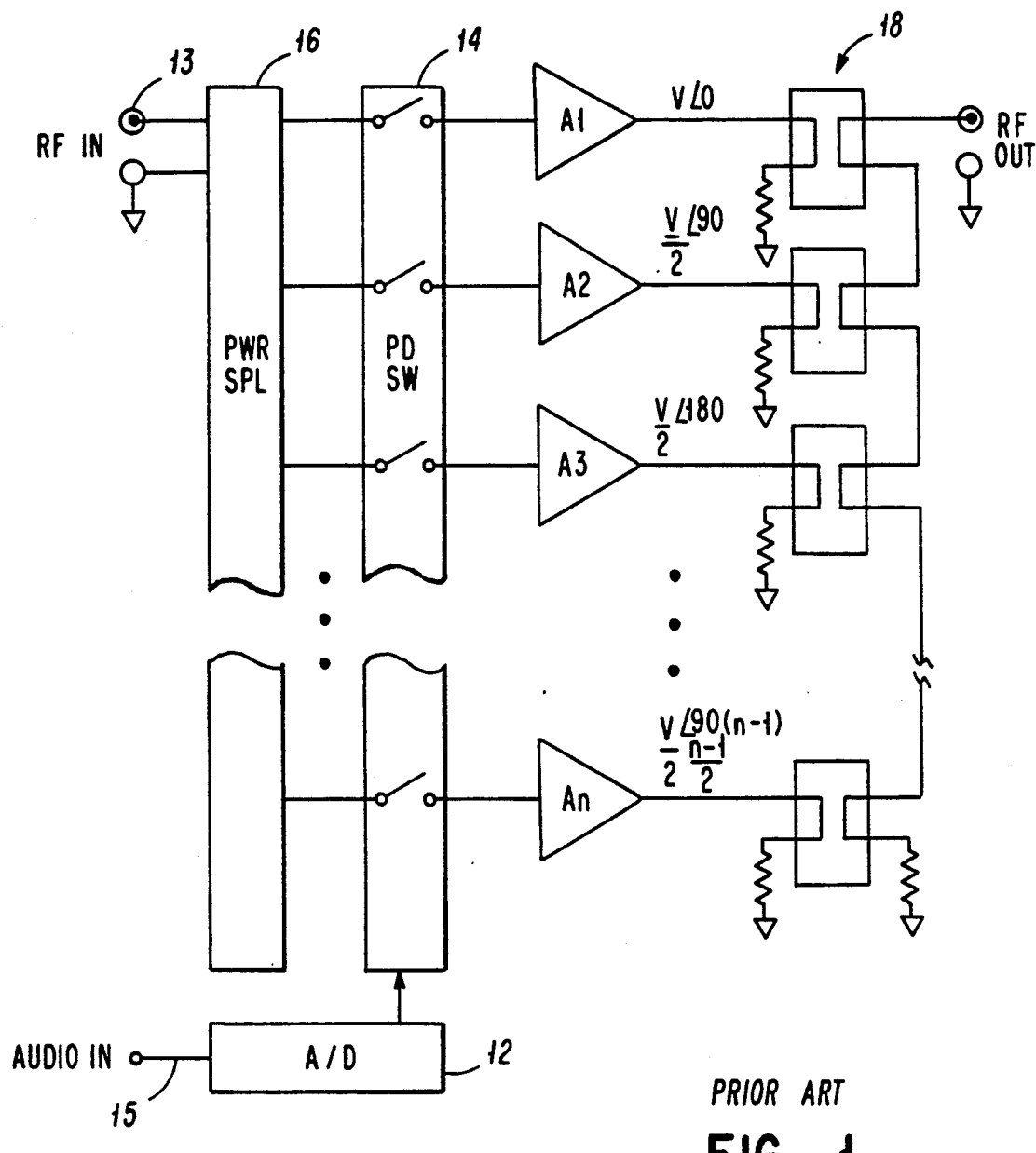
FIG. 1 is a schematic diagram of the prior art binary digital modulator discussed above as part of the technical background of this invention.
Figure 2:
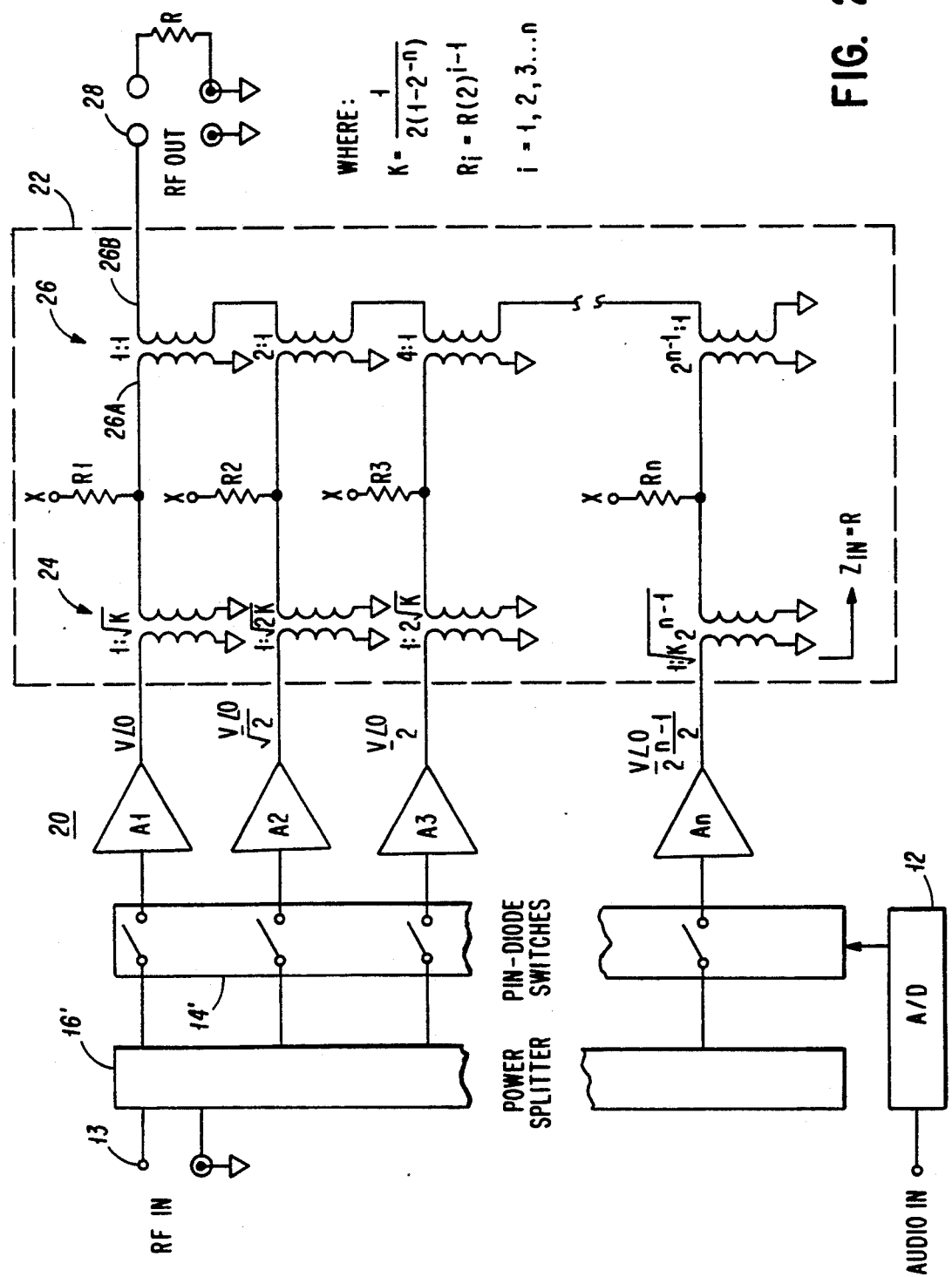
FIG. 2 is a schematic diagram of a preferred embodiment of the digital amplitude modulator of the present invention in generalized form having discrete coil transformers.

Referring now to the Figures, wherein like items are referenced as such throughout, FIG. 2 shows a schematic of a preferred embodiment of a digital amplitude modulator 20 constructed in accordance with the present invention, using a 0-degree, non-symmetrical power splitter 16' and combiner, or digital power combiner, 22. The signals from coherent phase power splitter 16' are passed through a set of pin diode switches 14' and amplifiers $A_1$ through $A_n$ to the combiner 22. Unlike the prior art modulator of FIG. 1, the digital amplitude modulator 20 splits RF input signals at an RF terminal 13 which are in phase. Not only does this provide wider bandwidths than quadrature hybrids, but the power splitting at the amplifier input is also simpler since all signals are in phase. The combining is performed by first and second sets of discrete, coil type transformers 24 and 26 having turns ratios $1:\sqrt{k}$; $1:\sqrt{2k}$; $1:2\sqrt{k}$; and $1:\sqrt{k2^{N-1}}$, respectively for the set of transformers comprising transformer 24 and 1:1; 2:1; 4:1; and $2^{N-1}$, respectively for the set of transformers comprising transformer 26. A plurality of isolation resistors R1 through RN are respectively connected between a reference X and the connection between the secondaries of the transformers 24 of the first group and the primaries of the transformers 26 of the second group. The secondaries, or outputs, of the second set of transformers 26 are combined in series with a single signal output terminal 28 for connection with a load R.

Although it appears that the input splitter 16 for the prior art modulator in FIG. 1 can use the same hybrid topology as the output, this is not true. To achieve the required +90 degree phase differences, or steps, between the input signals of the prior art modulator shown in FIG. 1, the input must be at the $n^{th}$ hybrid. The maximum loss of the input splitter consequently occurs at the stage where maximum drive is required. On the other hand, the 0-degree splitters/combiner of FIG. 2 does not require this reverse phase sequence because all voltages are in phase.

Figure 3:
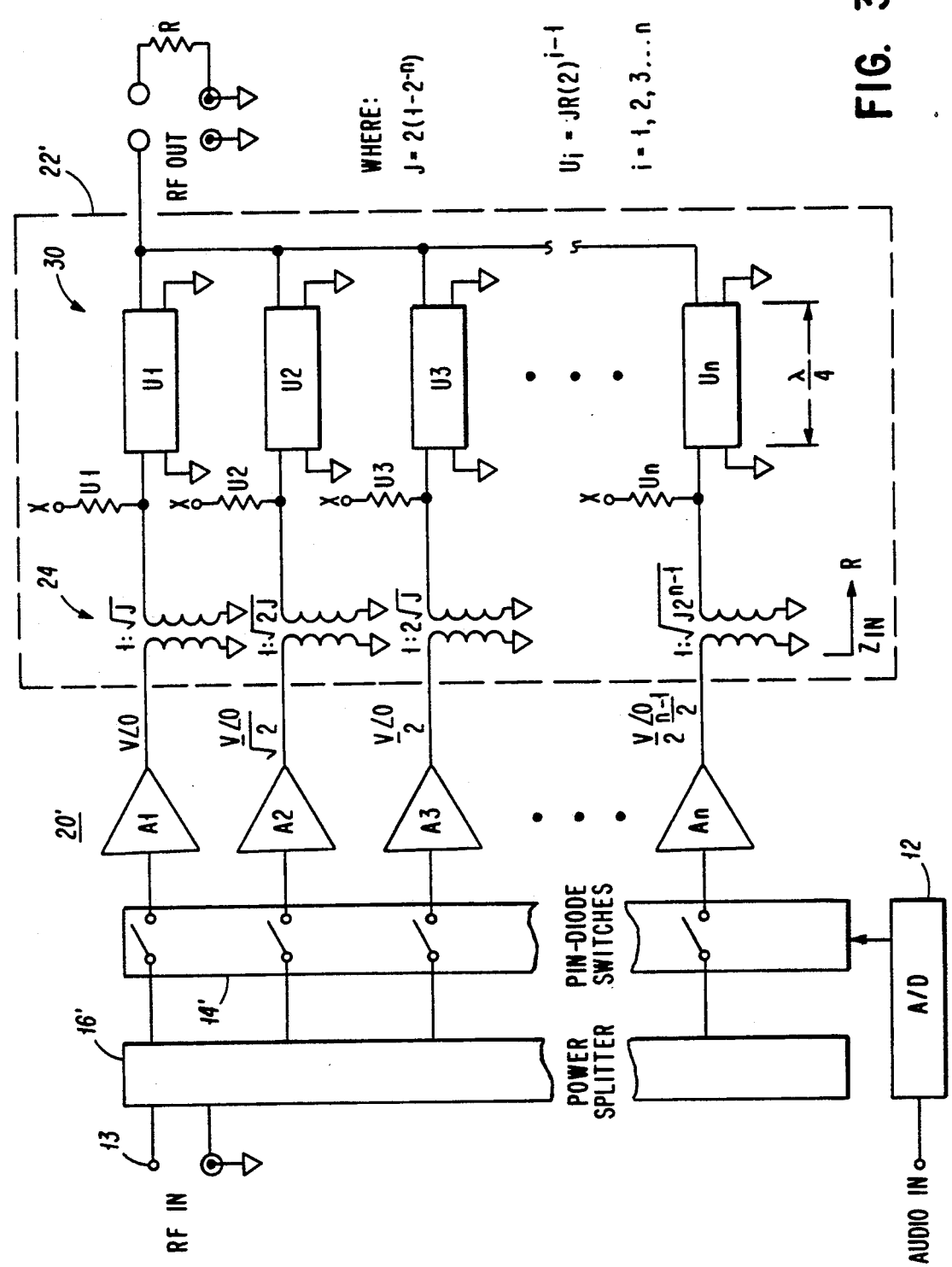
FIG. 3 is a schematic diagram of another form of the digital amplitude modulator in generalized form in which the combining function is performed by transmission line element transformers.

Referring now to FIG. 3, another embodiment 20' of the digital amplitude modulator is shown which uses a plurality of transmission line transformers U1 through Un, collectively designated as 30, in place of the coil transformers 26 in the combiner 22 of FIG. 2. Embodiment 20' of the digital modulator is particularly well suited for higher frequencies and an approximately 2:1 bandwidth. The electrical length of transmission line transformer U1 through Un, however, must be close to one quarter wavelength of the signal for proper operation.

The 0-degree modulator efficiency equations for FIG. 3 that are analogous to equations (1)–(3) for the digital modulator of FIG. 2, are as follows:

$$P_{in} = 2 c V^2 M \text{ (same as prior art device of FIG. 1)}$$

$$P_{out} = 2 c^2 V^2 M^2$$

$$Eff = P_{out}/P_{in} = M$$

It should be noted that the efficiency calculated above is not multiplied by "c" as in equation (3). Since "c" is bounded between 0 and 1, the efficiency at any modulation index is always less for the modulator of FIG. 1. As a consequence, the two tone efficiency derivation is identical for the 0-degree modulator except that again the "c" is dropped, resulting in 78.5% rather than "c" times 78.5% for the efficiency level. It should also be noted that if n=3, c=0.875 and M=1, the peak envelope efficiency is only 87.5% for the modulator of FIG. 1 compared to 100% for the 0-degree modulator of FIG. 3. For a practical system with reasonable distortion, as shown below, only 5 bits are necessary, and a corresponding c=0.969 is quite tolerable.

Figure 4:
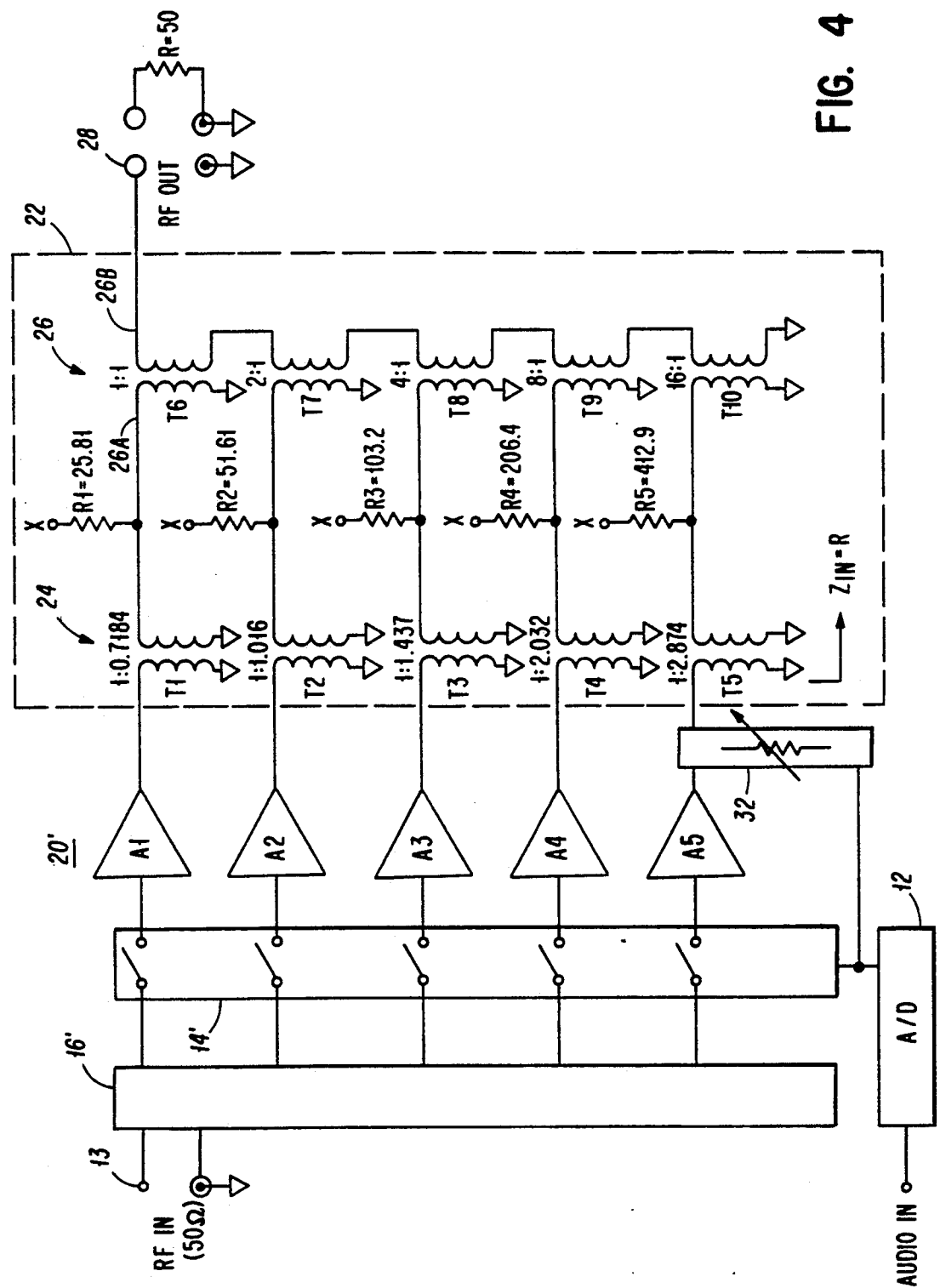
FIG. 4 is a schematic diagram of a specific amplitude modulator of the form of FIG. 2 with N=5.
Figure 5:
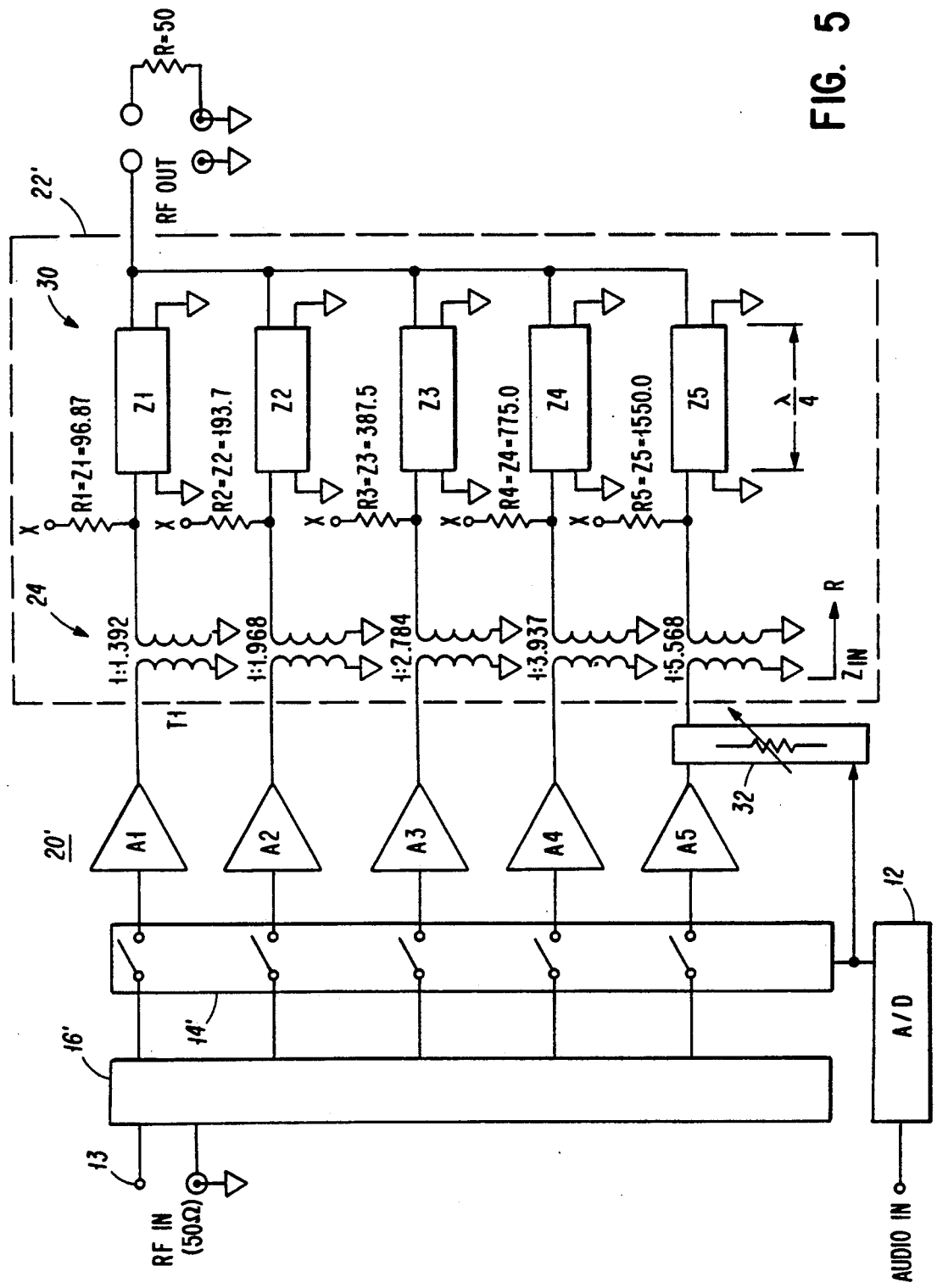
FIG. 5 is a schematic diagram of a specific amplitude modulator of the form of FIG. 3 with N=5.

Referring to FIGS. 4 and 5, if better waveform fidelity is desired than can be provided by a 5-bit system, a progammable attenuator 32 driven by the 5th bit amplifier A5 can be used for the fifth and smaller bits. The efficiency remains unchanged, but the fifth bit amplifier A5 must be capable of delivering the same power as the fourth bit amplifier A4. FIGS. 4–5 show 0-degree, 5-bit realizations using the equations discussed with reference to the two forms of the invention shown in FIGS. 2–3, respectively. Both the forms of FIGS. 4 and 5 include an optional programmable attenuator 32.

If the concept of use of a programmable attenuator 32 is taken to an extreme, a special case embodiment results consisting of a single amplifier driving a programmable attenuator. The disadvantage to such an approach is the resultant high power switching, dissipation and complexity of the attenuator. Nevertheless, this embodiment could certainly be a viable option in some cases. The efficiency versus modulation is still linear and identical to the multiple amplifier case.

Alternate embodiments of FIGS. 4–5 may be achieved by utilizing the component values set forth in Tables 1 and 2 below in lieu of those values indicated in the Figures.

TABLE 1

Transformers Turns Ratio and Resistor Value
(Alternate Embodiment of FIG. 4)

| T1 = 1:0.3592 | T6 = 0.5:1.0 | R1 = 6.452 |
|---|---|---|
| T2 = 1:0.5080 | T7 = 1.0:1.0 | R2 = 12.903 |
| T3 = 1:0.7184 | T8 = 2.0:1.0 | R3 = 25.806 |
| T4 = 1:1.0160 | T9 = 4.0:1.0 | R4 = 51.613 |
| T5 = 1:1.4368 | T10 = 8.0:1.0 | R5 = 103.226 |

To achieve more realizable characteristic impedances for the transmission line elements 30 in FIG. 5, a 1:4 ratio transformer can be coupled with the RF output resulting in the values below.

TABLE 2

Component Specifications
(Alternate Embodiment of FIG. 5)

| T1 = 1:0.3480 | R1 = 6.055 | Z1 = 6.055 |
|---|---|---|
| T2 = 1:0.4921 | R2 = 12.109 | Z2 = 12.109 |
| T3 = 1:0.6960 | R3 = 24.219 | Z3 = 24.219 |
| T4 = 1:0.9843 | R4 = 48.437 | Z4 = 48.437 |
| T5 = 1:1.3919 | R5 = 96.875 | Z5 = 96.875 |

It is thought that the apparatus and method of the present invention and many of its attendant advantages will be understood from the foregoing description, and it will be apparent that various changes may be made in the form, construction and arrangement of the parts and the steps thereof without departing from the spirit and scope of the invention, or sacrificing all their material advantages, the forms described herein being merely preferred embodiments thereof.

I claim:

1. A digital amplitude modulator for combining the power from a plurality of input signals respectively representing the bits of a plural bit digital word into a single output signal, comprising:
   a plurality of transformers for converting the plurality of input signals, respectively, and having transformer ratios which vary substantially in accordance with powers of two corresponding to the significance of the bit represented by the input signal being converted thereby; and
   a plurality of transmission line elements each having an electrical length equal to a quarter of the wave length of the input signals, and
   inputs connected to the plurality of transformers and outputs connected in common to each other on output terminals to produce the single output signal formed of a composite sum of the plurality input signals.

2. The digital amplitude modulator of claim 1 including means to provide the input signals with magnitudes that vary inversely in accordance with the same powers of two with respect to which the transformer ratios of the plurality of transformers vary.

3. The digital amplitude modulator of claim 1 including means for providing the input signals all in phase with one another.

4. The digital amplitude modulator of claim 1 including a plurality of isolation resistors
   connected at a juncture between the plurality of transformers and the plurality of transmission line elements, respectively, and
   having values which vary in accordance with the same powers of two that the transformer ratios of the plurality of transformers to which they are connected vary.

5. The digital amplitude modulator of claim 4 in which the transmission line elements have line impedance values that are substantially equal to the values of the isolation resistors to which they are connected, respectively.

6. The digital amplitude modulator of claim 1 in which the transmission line elements have characteristic line impedance values which vary in accordance with the same powers of two that the transformer ratios of the plurality of transformers to which they are connected vary.

7. The digital amplitude modulator of claim 1 in which said transformers are discrete coil transformers.

8. The digital amplitude modulator of claim 1 in which said transformers are transmission line transformers.

9. A digital amplitude modulator for combining the power from a plurality of input signals respectively representing the bits of a plural bit digital word into a single output signal, comprising:
   a first plurality of transformers for converting the input signals, respectively, and having transformer ratios which vary in substantial accordance with powers of two corresponding to the significance of the bit represented by the input signal being converted thereby;
   a second plurality of transformers having
      primaries respectively connected to the first plurality of transformers, respectively,
      secondaries all connected in series to an output terminal, and
      transformer ratios which vary inversely in substantial accordance with the same powers of two that the transformer ratios of the first plurality of transformers to which they are connected vary.

10. The digital amplitude modulator of claim 9 including means to provide the input signals with magnitudes which vary inversely in accordance with the same powers of two that the transformer ratios of the plurality of transformers vary.

11. The digital amplitude modulator of claim 9 including means for providing the input signals all in phase with one another.

12. The digital amplitude modulator of claim 9 in which said first plurality transformers are transmission line transformers.

13. The digital amplitude modulator of claim 9 in which said first plurality of transformers are discrete coil transformers.

* * * * *